(12) United States Patent
Jagarapu et al.

(10) Patent No.: US 11,994,924 B2
(45) Date of Patent: May 28, 2024

(54) POWER SUPPLY ASSEMBLY WITH INPUT MODULE AND POWER SUPPLY UNIT

(71) Applicant: Juniper Networks, Inc., Sunnyvale, CA (US)

(72) Inventors: Varaha Venkata Satya Narayana Jagarapu, Sunnyvale, CA (US); Muhammad Sagarwala, Los Gatos, CA (US); Katsuhiro Okamura, Watsonville, CA (US); Franklin Demick Boyden, Pleasanton, CA (US); Jaspal S. Gill, Tracy, CA (US); David K. Owen, Livermore, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 128 days.

(21) Appl. No.: 17/651,688

(22) Filed: Feb. 18, 2022

(65) Prior Publication Data
US 2023/0266807 A1 Aug. 24, 2023

(51) Int. Cl.
G06F 1/28 (2006.01)
(52) U.S. Cl.
CPC .................................... *G06F 1/28* (2013.01)
(58) Field of Classification Search
CPC ........................................................ G06F 1/28
See application file for complete search history.

(56) References Cited

U.S. PATENT DOCUMENTS

| 6,293,828 | B1 * | 9/2001 | Colver ................. H05K 7/1457 439/680 |
| 6,489,748 | B1 | 12/2002 | Okamura |
| 7,884,495 | B2 | 2/2011 | Kojori |
| 9,035,609 | B1 * | 5/2015 | Kim ..................... H02J 7/0045 320/112 |
| 10,454,280 | B2 | 10/2019 | Morin |

(Continued)

FOREIGN PATENT DOCUMENTS

DE 8803662 U1 4/1989

OTHER PUBLICATIONS

Extended European Search Report for Application No. EP22165970.9, dated Oct. 11, 2022, 13 pages.

*Primary Examiner* — Mark A Connolly
(74) *Attorney, Agent, or Firm* — Harrity & Harrity, LLP

(57) ABSTRACT

A power supply assembly includes an input module that includes one or more captive screws, one or more first power supply connection components, and one or more first input feed connection components; and a power supply unit that includes one or more captive screw connection switches, one or more second power supply connection components, and one or more second input feed connection components. The input module is to physically and electrically connect to the power supply unit; the one or more captive screws are to physically engage, respectively, the one or more captive screw connection switches; the one or more first power supply connection components are to physically and electrically connect to, respectively, the one or more second power supply connection components; and the one or more first input feed connection components are to physically and electrically connect to, respectively, the one or more second input feed connection components.

20 Claims, 10 Drawing Sheets

(56) References Cited

U.S. PATENT DOCUMENTS

| | | | | |
|---|---|---|---|---|
| 2007/0271403 | A1* | 11/2007 | Kojori | H02J 1/001 |
| | | | | 710/302 |
| 2014/0375294 | A1* | 12/2014 | Lv | H01R 29/00 |
| | | | | 323/299 |
| 2015/0003015 | A1 | 1/2015 | Kulkarni et al. | |
| 2015/0177797 | A1 | 6/2015 | Butzer et al. | |
| 2022/0255269 | A1* | 8/2022 | Gutfeldt | G06F 1/28 |

* cited by examiner

POWER SUPPLY ASSEMBLY WITH INPUT MODULE AND POWER SUPPLY UNIT

BACKGROUND

A power supply module (PSM) is an electronic device that supplies electrical energy to an electrical load. The PSM may be a discrete device or may be built into another device (e.g., a power system), such as a PSM included in a desktop computer, a consumer electronics device, a network device, or the like. The power system may have multiple PSMs to supply power to one or more electrical loads associated with the power system. The power system may also have one or more backup PSMs in case of a failure by a PSM.

SUMMARY

In some implementations, a power supply assembly includes an input module; and a power supply unit, wherein: the input module includes: one or more captive screws, one or more first power supply connection components, one or more first input feed connection components, and one or more visual indicators; the power supply unit includes: one or more captive screw connection switches, one or more second power supply connection components, one or more second input feed connection components, a power switch, one or more circuitry elements, and one or more processors; and the input module and the power supply unit are to be physically and electrically connected.

In some implementations, an input module of a power supply assembly includes one or more captive screws; one or more first power supply connection components; and one or more first input feed connection components, wherein: the input module is to physically and electrically connect to a power supply unit of the power supply assembly, the one or more captive screws are to physically engage, respectively, one or more captive screw connection switches of the power supply unit, the one or more first power supply connection components are to physically and electrically connect to, respectively, one or more second power supply connection components of the power supply unit, and the one or more first input feed connection components are to physically and electrically connect to, respectively, one or more second input feed connection components of the power supply unit.

In some implementations, a power supply unit of a power supply assembly includes one or more captive screw connection switches; one or more second power supply connection components; one or more second input feed connection components; a power switch; one or more circuitry elements; and one or more processors, wherein: the power supply unit is to physically and electrically connect to an input module of the power supply assembly, the one or more captive screw connection switches are to be, respectively, physically engaged by one or more captive screws of the input module, the one or more second power supply connection components are to physically and electrically connect to, respectively, one or more first power supply connection components of the input module, and the one or more second input feed connection components are to physically and electrically connect to, respectively, one or more first input feed connection components of the input module.

DETAILED DESCRIPTION

Figure 1A:
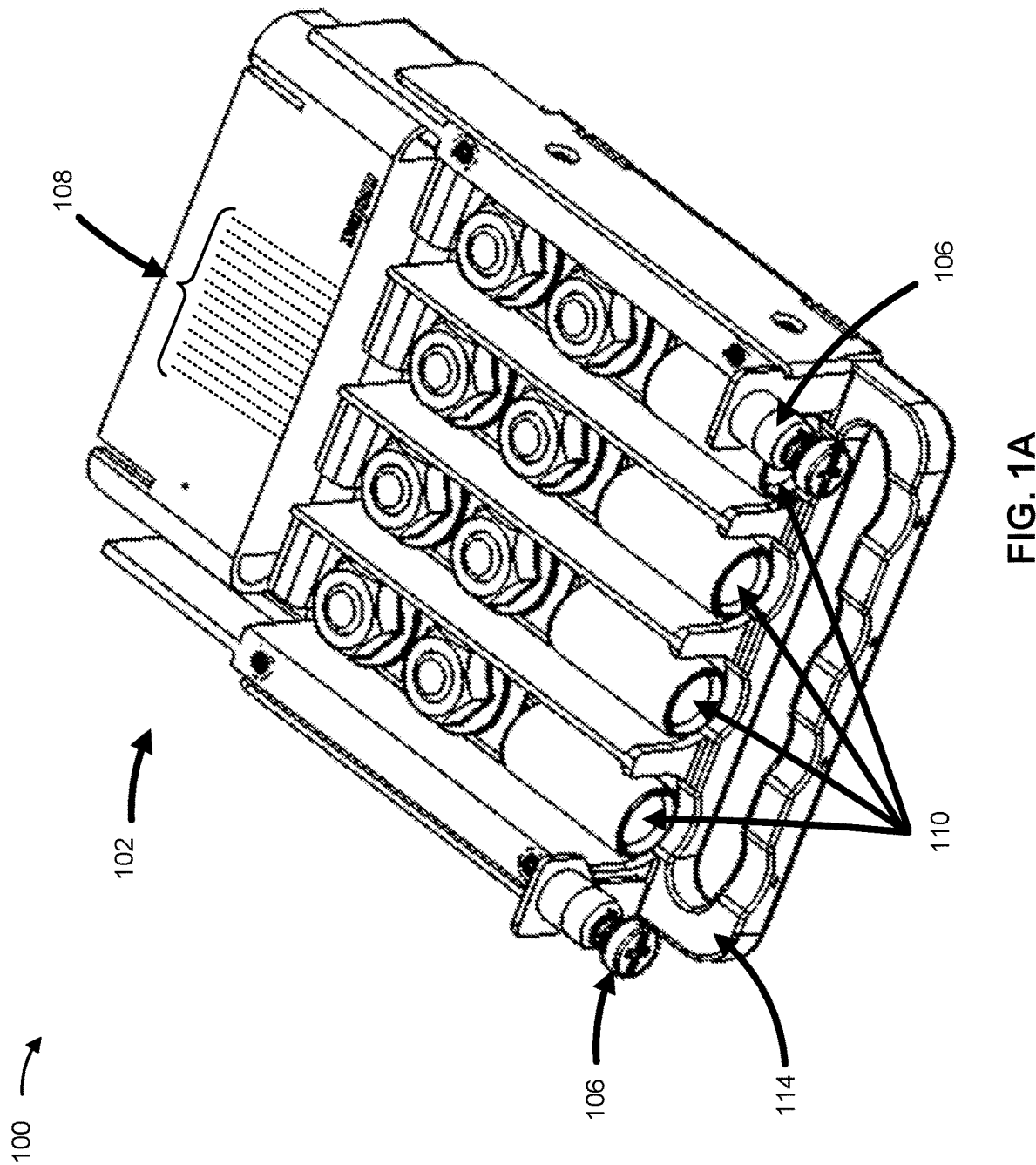
FIGS. 1A-1G are diagrams of an example implementation of a power supply assembly described herein.
Figure 1B:
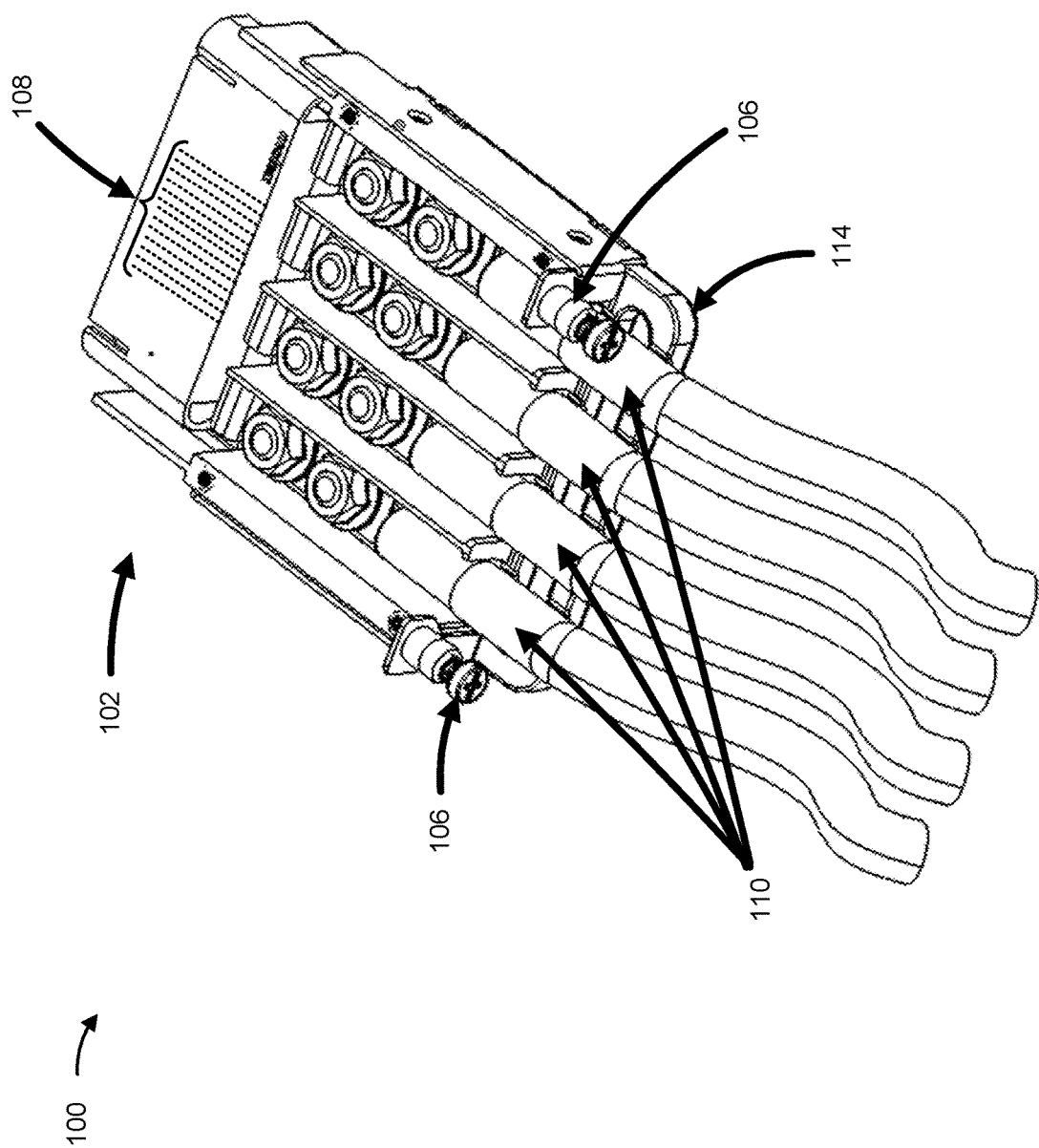
Figure 1C:
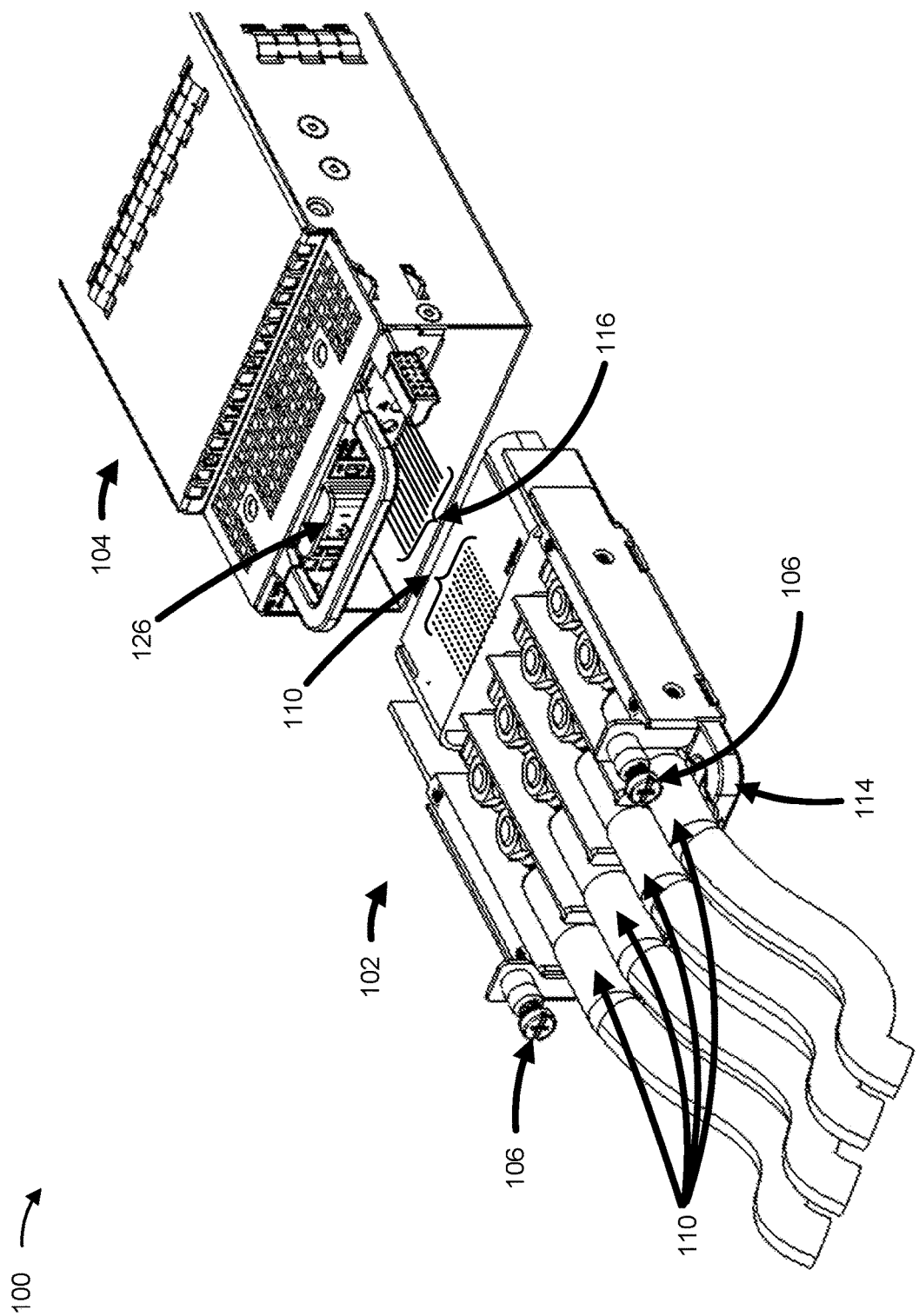
Figure 1D:
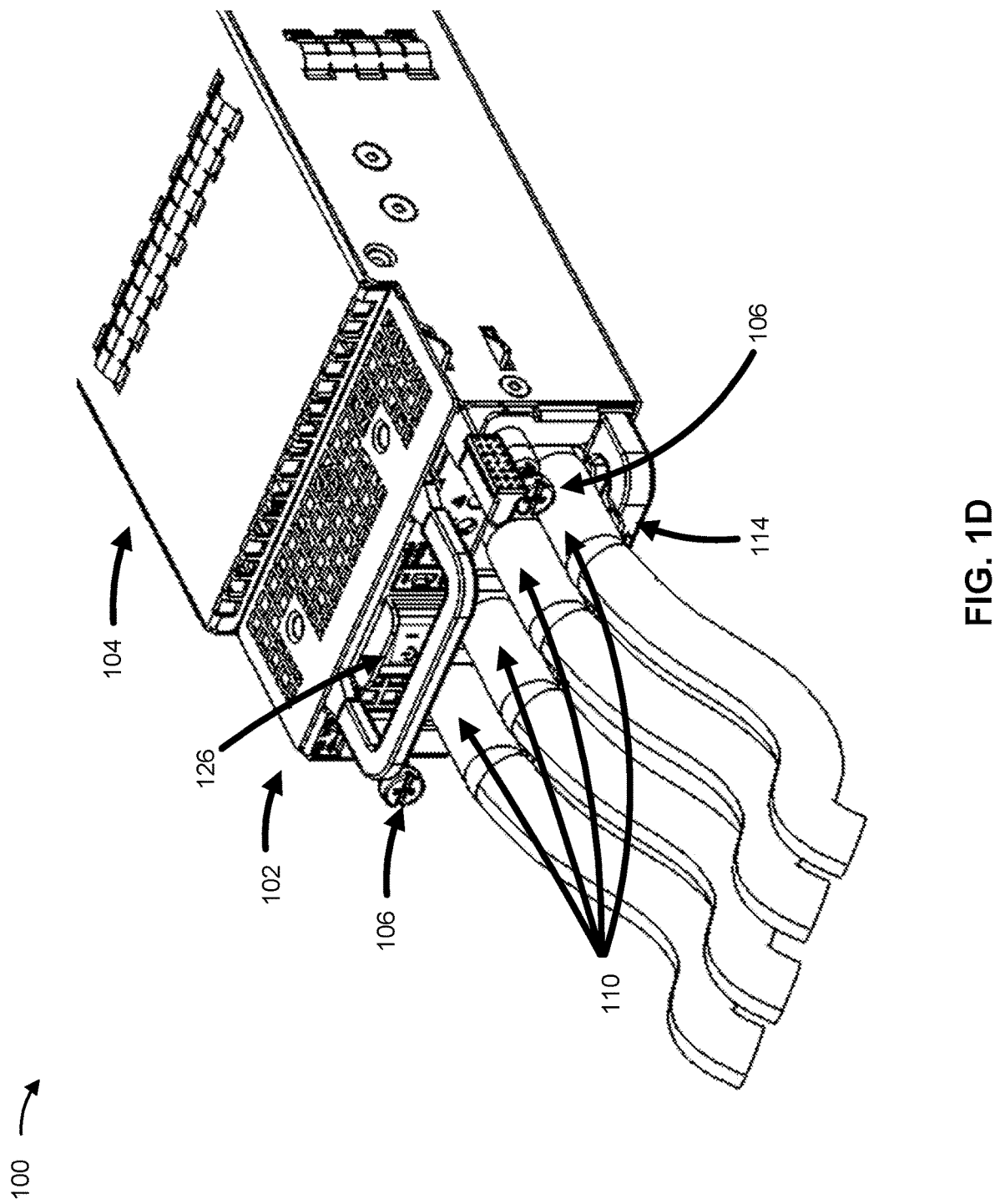

The following detailed description of example implementations refers to the accompanying drawings. The same reference numbers in different drawings may identify the same or similar elements.

A typical high-capacity network device (e.g., a router, a switch, a firewall, a server, or a similar network device) includes multiple PSMs (e.g., 20 to 30 PSMs) for providing power (e.g., direct current (DC) power) to the network device. Each PSM is connected to multiple input feed cables (e.g., that provide the DC power to the PSM). Consequently, the multiple input feed cables (e.g., 80 to 120) need to be managed by a technician that services the network device. Further, because of the vast number of input feed cables, servicing an individual PSM (e.g., performing a "hot swap" operation to remove and replace the PSM) is physically difficult and potentially dangerous to the technician (e.g., because a number of specific steps are needed to be performed by the technician to power down the PSM before removing the PSM). In some cases, such as when a PSM has not been properly powered down, attempting to remove the PSM can cause an arcing event that endangers (e.g., due to a risk of causing an electrical shock, a risk of starting a fire, or another issue) the technician, the PSM, and the network device.

Some implementations described herein provide a power supply assembly that includes an input module and a power supply unit. The input module includes one or more captive screws, one or more first power supply connection components, one or more first input feed connection components, and one or more visual indicators. The power supply unit includes one or more captive screw connection switches, one or more second power supply connection components, one or more second input feed connection components, a power switch, one or more circuitry elements (e.g., a boost converter device and/or a DC-to-DC converter device), and one or more processors. The input module and the power supply unit are to be physically and electrically connected. Accordingly, the one or more captive screws are to physically engage, respectively, the one or more captive screw connection switches; the one or more first power supply connection components are to physically and electrically connect to, respectively, the one or more second power supply connection components; and the one or more first input feed connection components are to physically and electrically connect to, respectively, the one or more second input feed connection components.

In some implementations, the one or more processors of the power supply unit determine when to activate (e.g., turn on) or deactivate (e.g., turn off) the one or more circuitry elements of the power supply unit. For example, the one or more processors make a first determination as to whether the one or more captive screws are physically engaging, respectively, the one or more captive screw connection switches; make a second determination as to whether the one or more first power supply connection components are physically and electrically connected to, respectively, the one or more second power supply connection components; make a third determination as to whether the one or more first input feed connection components are physically and electrically connected to, respectively, the one or more second input feed connection components; and make a fourth determination as to whether the power switch is physically set to an on position. The one or more processors activate the one or more circuitry elements when the first determination, the second determination, the third determination, and the fourth determination are positive determinations, and, alternatively, deactivate the one or more circuitry elements when at least one of the first determination, the second determination, the third determination, and the fourth determination is not a positive determination.

In this way, some implementations described herein enable the power supply assembly to be fully powered only when the input module and the power supply unit are physically and electrically connected. Further, some implementations described herein enable the power supply assembly to cease being fully powered when a particular physical connection and/or electrical connection between the input module and the power supply unit is disturbed. This simplifies, for a technician, servicing an individual power supply assembly because power control management of the power supply assembly is handled by the power supply assembly. Further, this reduces a likelihood that the power supply assembly has not been properly powered down, which reduces a likelihood of an arcing event occurring during servicing of the power supply assembly. Accordingly, a risk of endangerment to the technician, the power supply assembly, and a network device associated with the power supply assembly is reduced (e.g., as to compared to the technician manually performing steps to power down the power supply assembly).

Figure 1E:
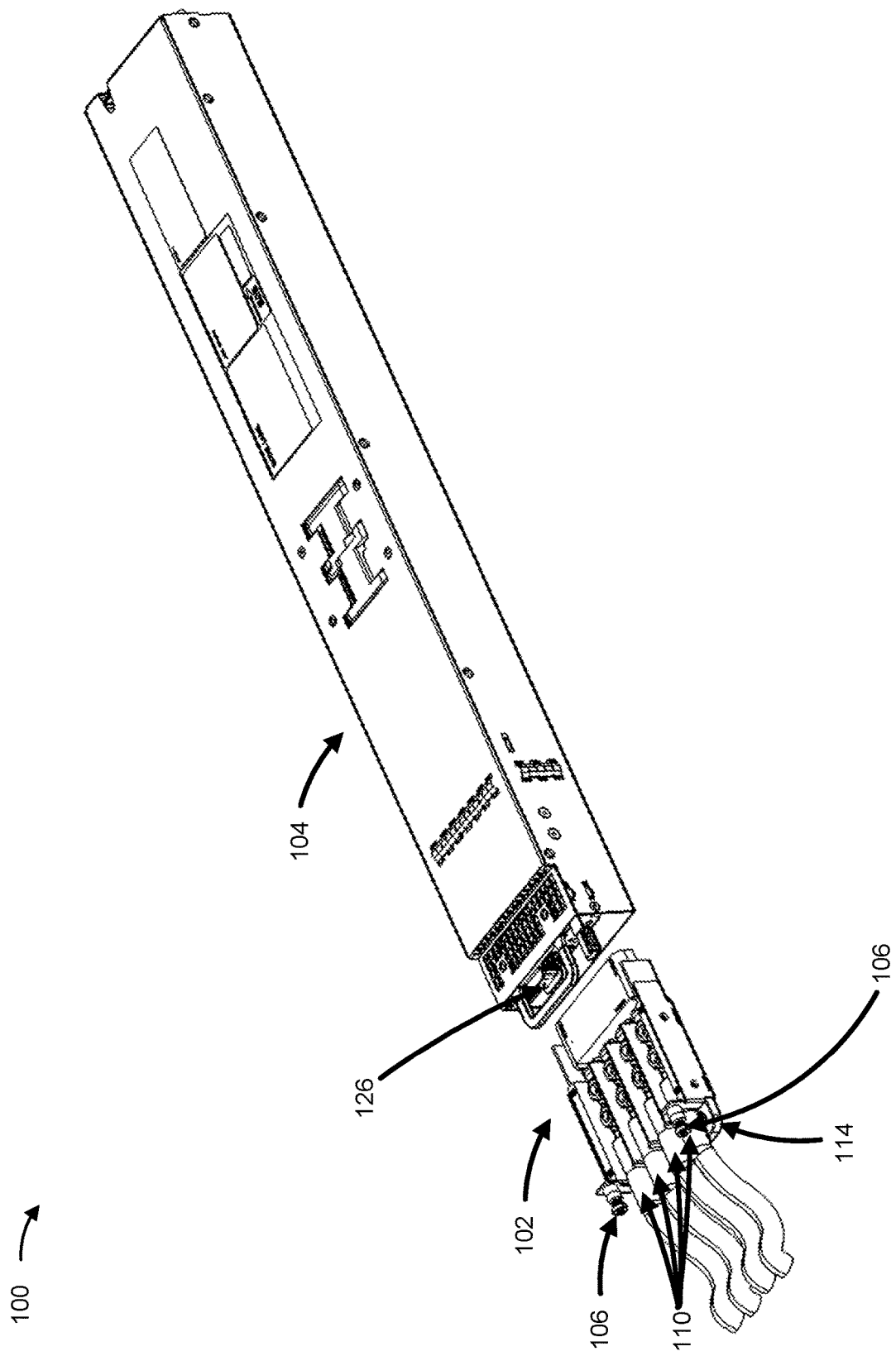

Further, in some implementations, the input module is smaller than the power supply unit (e.g., as shown in FIG. 1E). Accordingly, the input module may be removed from the power supply unit to service the power assembly (as opposed to removing the entire power supply assembly). Due to the input module's reduced size (and the handle of the input module), removing and servicing the input module (and any feed cables attached to the input module) is physically easier for a technician to perform, as compared to removing and service a larger, monolithic PSM. Additionally, because of the input module's reduced size, feed cables that attach to the input module may be shorter and/or experience less bending (and are thereby less likely to be damaged) than that of feed cables for a conventional PSM (e.g., that must be longer and/or experience more bending due to physical manipulation of a larger, monolithic PSM during servicing). Moreover, because the power supply assembly is split into the input module and the power supply unit, different physical configurations of the power supply assembly are enabled, as compared to typical PSMs that require horizontal physical configurations. For example, the power supply assembly can have a horizontal orientation, a vertical orientation, or an angled orientation (e.g., when included in a network device), which enables the network device to be used in more different physical configurations or layouts than what is possible when a network device includes a typical PSM.

Figure 1F:
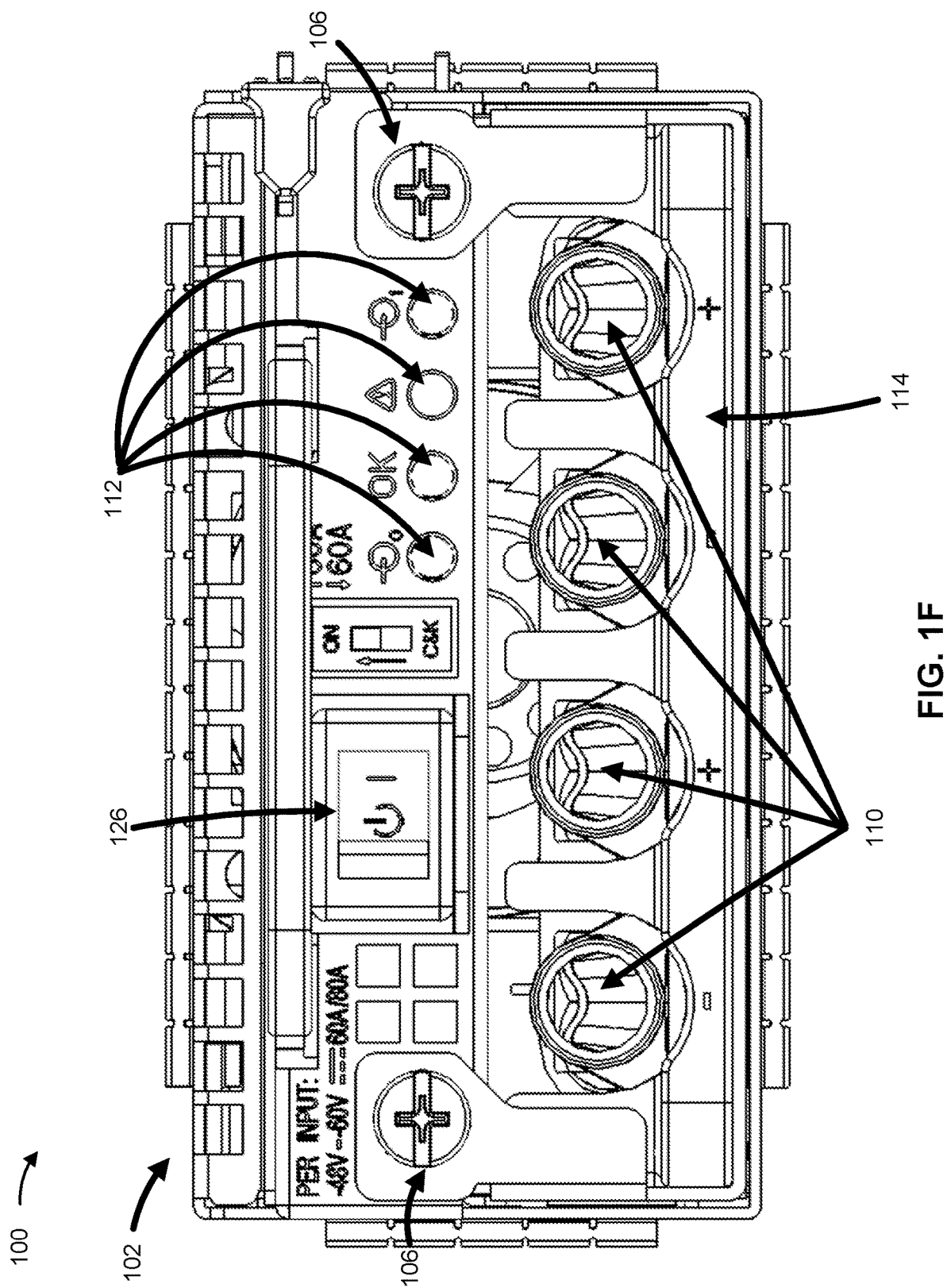
Figure 1G:
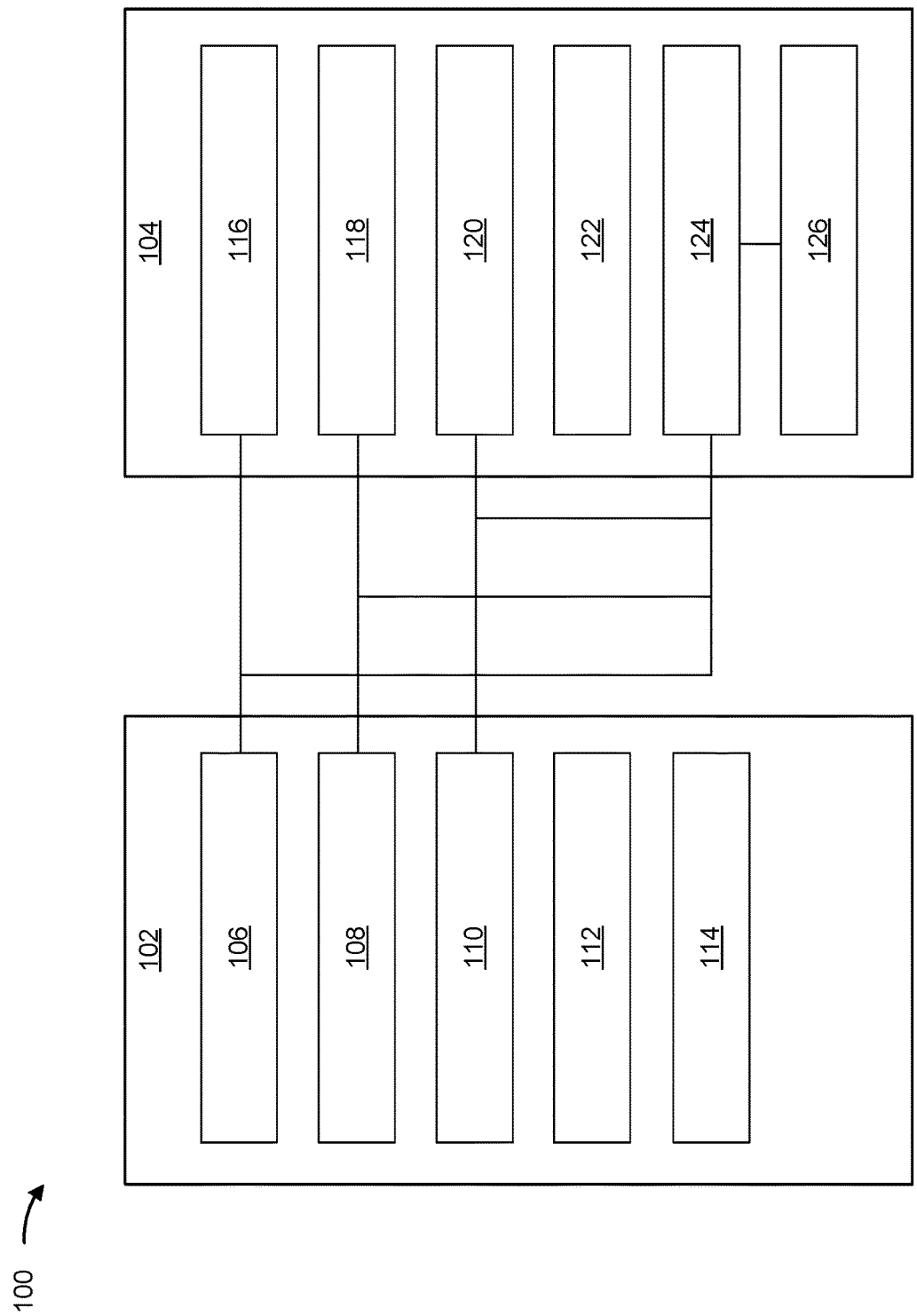

FIGS. 1A-1G are diagrams of one or more example implementations of a power supply assembly 100 described herein. The power supply assembly 100 may include an input module 102 and a power supply unit 104. FIGS. 1A-1F show views of example physical implementations of the input module 102 and the power supply unit 104. FIG. 1G shows example logical implementations of the input module 102 and the power supply unit 104.

The input module 102 and the power supply unit 104 may be configured to be physically and electrically connected. For example, as shown in FIGS. 1A-1F, the input module 102 may insert into the power supply unit 104, such that one or more components of the input module 102 and one or more components of the power supply unit 104 are physically connected and/or electrically connected.

As shown in FIGS. 1A-1G, the input module 102 may include one or more captive screws 106, one or more first power supply connection components 108, one or more first input feed connection components 110, one or more visual indicators 112, and a handle 114. As further shown in FIGS. 1A-1G, the power supply unit 104 may include one or more captive screw connection switches 116, one or more second power supply connection components 118, one or more second input feed connection components 120, one or more circuitry elements 122, one or more processors 124, and a power switch 126.

The one or more captive screws 106 of the input module 102 may be configured to physically fasten the input module 102 to the power supply unit 104 (e.g., when the input module 102 and the power supply unit 104 are physically connected, such as when the input module 102 is inserted into the power supply unit 104). In some implementations, the one or more captive screws 106 may be configured to physically engage, respectively, the one or more captive screw connection switches 116 of the power supply unit 104 (e.g., when the input module 102 and the power supply unit 104 are physically connected). For example, each captive screw 106, of the one or more captive screws 106, may physically engage a corresponding captive screw connection switch 116, of the one or more captive screw connection switches 116, which may cause the corresponding captive screw connection switch 116 to close (or, alternatively, to open). In this way, the one or more captive screws 106 of the input module 102 physically engaging, respectively, the one or more captive screw connection switches 116 of the power supply unit 104 facilitates activation of the one or more circuitry elements 122 of the power supply unit 104. For example, the one or more processors 124 of the power supply unit 104 may determine that the one or more captive screws 106 are physically engaging, respectively, the one or more captive screw connection switches 116, and may, in some implementations, activate the one or more circuitry elements 122 of the power supply unit 104 (e.g., as further described herein).

The one or more first power supply connection components 108 of the input module 102 may include one or more pins (e.g., one or more short pins and/or one or more long pins), or one or more other types of connection components. Accordingly, the one or more second power supply connection components 118 may include one or more sleeves (e.g., for accepting the one or more first power supply connection components 108 of the input module 102), or one or more other types of connection components. In some implementations, the one or more first power supply connection components 108 may comprise one or more "male" connection components and the one or more second power supply connection components 118 may include one or more "female" connection components, or vice versa.

In some implementations, the one or more first power supply connection components 108 may be configured to physically and electrically connect to, respectively, the one or more second power supply connection components 118 (e.g., when the input module 102 and the power supply unit 104 are physically connected, such as when the input module 102 is inserted into the power supply unit 104). For example, each first power supply connection component 108, of the one or more first power supply connection components 108, may physically and electrically connect to a corresponding second power supply connection component 118 of the one or more second power supply connection components 118. In this way, the one or more first power supply connection components 108 of the input module 102 physically and electrically connecting to, respectively, the one or more second power supply connection components 118 of the power supply unit 104 facilitates activation of the one or more circuitry elements 122 of the power supply unit 104. For example, the one or more processors 124 of the power supply unit 104 may determine that the one or more first power supply connection components 108 are physically and electrically connected to, respectively, the one or more second power supply connection components 118, and may therefore, in some implementations, activate the one or more circuitry elements 122 of the power supply unit 104 (e.g., as further described herein).

The one or more first input feed connection components 110 of the input module 102 may include one or more feed connectors (e.g., for receiving one or more direct current (DC) feeds), or one or more other types of feed connection components. Accordingly, the one or more second input feed connection components 120 of the power supply unit 104 may include one or more feed connectors (e.g., for accepting the one or more DC feeds from the one or more first input feed connection components 110), or one or more other types of feed connection components. In some implementations, the one or more first input feed connection components 110 may comprise one or more male feed connection components and the one or more second input feed connection components 120 may include one or more female feed connection components, or vice versa.

In some implementations, the one or more first input feed connection components 110 may be configured to physically and electrically connect to, respectively, the one or more second input feed connection components 120 (e.g., when the input module 102 and the power supply unit 104 are physically connected, such as when the input module 102 is inserted into the power supply unit 104). For example, each first input feed connection component 110, of the one or more first input feed connection components 110, may physically and electrically connect to a corresponding second input feed connection component 120 of the one or more second input feed connection components 120. In this way, the one or more first input feed connection components 110 of the input module 102 physically and electrically connecting to, respectively, the one or more second input feed connection components 120 of the power supply unit 104 facilitates activation of the one or more circuitry elements 122 of the power supply unit 104. For example, the one or more processors 124 of the power supply unit 104 may determine that the one or more first input feed connection components 110 are physically and electrically connected to, respectively, the one or more second input feed connection components 120, and may, in some implementations, activate the one or more circuitry elements 122 of the power supply unit 104 (e.g., as further described herein).

The power switch 126 of the power supply unit 104 may include a manual switch (e.g., that is configured to be operated by a technician). The power switch 126 may be, for example, a toggle switch that can be toggled to an "on" position or an "off" position (e.g., by the technician). As shown in FIG. 1F, the power switch 126 may be positioned on the power supply unit 104 such that the power switch is accessible to the technician when the input module 102 is inserted in the power supply unit 104 (e.g., the power switch 126 is positioned to be manipulated via a hole in a faceplate of the input module 102). Accordingly, the technician may manually manipulate the power switch 126 to the on position to facilitate activation of the one or more circuitry elements 122 of the power supply unit 104. For example, the one or more processors 124 of the power supply unit 104 may determine that the power switch 126 is physically set to the on position and may, in some implementations, activate the one or more circuitry elements 122 of the power supply unit 104 (e.g., as further described herein).

The one or more visual indicators 112 of the input module 102 may include one or more light emitting diodes (LEDs), one or more liquid crystal display (LCD) panels, and/or one or more other types of visual displays. In some implementations, the one or more visual indicators 112 may indicate information associated with the input module 102 and/or the power supply unit 104 (e.g., based on a color and/or light pattern of the one or more visual indicators 112, a message displayed by the one or more visual indicators 112, and/or an image or icon displayed by the one or more visual indicators 112, among other examples). For example, the one or more visual indicators 112 may indicate a status of a feed connection associated with a first input feed connection component 110, of the one or more first input feed connection components 110, of the input module 102, or a corresponding second input feed connection component 120, of the one or more second input feed connection components 120, of the power supply unit 104; a status of a physical and electrical connection between the input module 102 and the power supply unit 104; a status associated with activation of the one or more circuitry elements 122 of the power supply unit 104; and/or a status associated with the power switch 126 of the power supply unit 104. In some implementations, the one or more processors 124 of the power supply unit 104 may provide one or more signals to the one or more visual indicators 112 to cause the one or more visual indicators 112 to indicate the information associated with the input module 102 and/or the power supply unit 104 (e.g., as further described herein).

The handle 114 of the input module 102 may be included on an outside surface of the input module 102. The handle 114 may be configured to facilitate physical and electrical connection or disconnection of the input module 102 and the power supply unit 104 by a technician. For example, the technician may hold the input module 102 by the handle 114 and may push on the handle 114 to insert the input module 102 into the power supply unit 104 (e.g., to cause the input module 102 and power supply unit 104 to be physically and electrically connected). As another example, the technician may pull on the handle 114 to remove the input module 102 from the power supply unit 104 (e.g., to cause the input module 102 and power supply unit 104 to be physically and electrically disconnected).

The one or more circuitry elements 122 of the power supply unit 104 may include a boost converter device, a DC-to-DC converter device, and/or one or more other circuitry elements, such as for manipulating voltages of DC feeds provided to the power supply unit 104 by the one or more first input feed connection components 110 of the input module 102 and the one or more second input feed connection components 120 of the power supply unit 104. The one or more processors 124 may control when the one or more circuitry elements 122 are activated or deactivated (e.g., as further described herein). Activating the one or more circuitry elements 122 may include turning "on" the one or more circuitry elements (e.g., enabling the one or more circuitry elements 122 and/or causing the one or more circuitry elements 122 to be operative). Deactivating the one or more circuitry elements 122 may include turning "off" the one or more circuitry elements (e.g., disabling the one or more circuitry elements 122 and/or causing the one or more circuitry elements 122 to be inoperative). When the one or more circuitry elements 122 are activated (e.g., by the one or more processors 124, after being deactivated), the one or more circuitry elements 122 may be turned on, such as in a sequential order. For example, the boost converter device may be activated first and the DC-to-DC converter device may be activated second. When the one or more circuitry elements 122 are deactivated (e.g., by the one or more processors 124, after being activated), the one or more circuitry elements 122 may be turned off, such as in a sequential order. For example, the DC-to-DC converter device may be deactivated first and the boost converter device may be deactivated second. In this way, likelihood of an arcing event occurring when activating and/or deactivating the one or more circuitry elements 122 is minimized.

The one or more processors 124 of the power supply unit 104 may be configured to activate or deactivate the one or more circuitry elements 122. In some implementations, the one or more processors 124 may monitor one or more physical connections and/or electrical connections between the input module 102 and the power supply unit 104 and determine, based on monitoring the one or more physical connections and/or the electrical connections, whether to activate or deactivate the one or more circuitry elements 122.

For example, the one or more processors 124 may make a first determination as to whether the one or more captive screws 106 of the input module 102 are physically engaging, respectively, the one or more captive screw connection switches 116; may make a second determination as to whether the one or more first power supply connection components 108 are physically and electrically connected to, respectively, the one or more second power supply connection components 118; may make a third determination as to whether the one or more first input feed connection components 110 are physically and electrically connected to, respectively, the one or more second input feed connection components 120; and/or may make a fourth determination as to whether the power switch 126 is physically set to an on position. Accordingly, the one or more processors 124 may activate or deactivate the one or more circuitry elements 122 (e.g., based on at least one of the first determination, the second determination, the third determination, or the fourth determination)

As an example, the one or more processors 124 may activate, based on at least a threshold number of the first determination, the second determination, the third determination, or the fourth determination being a "positive" determination (e.g., determinations that physical connections, electrical connections, and/or on positions are present), the one or more circuitry elements 122. The threshold number may be 1 (e.g., only one determination, of four determinations, needs to be positive), 2, 3, or 4 (e.g., all four determinations need to be positive). For example, the one or more processors 124 may activate the one or more circuitry elements 122 based on each of the first determination, the second determination, the third determination, and the fourth determination being a positive determination. Alternatively, the one or more processors 124 may deactivate, based on less than the threshold number of the first determination, the second determination, the third determination, or the fourth determination being positive determinations, the one or more circuitry elements 122. For example, the one or more processors 124 may deactivate the one or more circuitry elements 122 based on at least one of the first determination, the second determination, the third determination, and the fourth determination not being a positive determination.

In some implementations, the one or more processors 124 may provide one or more signals to the one or more visual indicators 112 of the input module 102 (e.g., based on activating or deactivating the one or more circuitry elements 122). For example, the one or more processors 124 may provide the one or more signals when the one or more processors 124 determine that the one or more first input feed connection components 110 are, or are not, physically and electrically connected to, respectively, the one or more second input feed connection components 120 (e.g., to cause the one or more visual indicators 112 to indicate a status of a feed connection associated with a first input feed connection component 110, of the one or more first input feed connection components 110, or a corresponding second input feed connection component 120 of the one or more second input feed connection components 120). As another example, the one or more processors 124 may provide the one or more signals when the one or more processors 124 activate or deactivate the one or more circuitry elements 122 (e.g., to cause the one or more visual indicators 112 to indicate a status of a physical and electrical connection between the input module and the power supply unit and/or to indicate a status associated with activation of the one or more circuitry elements 122). As another example, the one or more processors 124 may provide the one or more signals when the one or more processors 124 determine whether the power switch 126 of the power supply unit 104 is physically set to an on position (e.g., to cause the one or more visual indicators 112 to indicate a status associated with the power switch 126).

As indicated above, FIGS. 1A-1G are provided as an example. Other examples may differ from what is described with regard to FIGS. 1A-1G. The number and arrangement of devices shown in FIGS. 1A-1G are provided as an example. In practice, there may be additional devices, fewer devices, different devices, or differently arranged devices than those shown in FIGS. 1A-1G. Furthermore, two or more devices shown in FIGS. 1A-1G may be implemented within a single device, or a single device shown in FIGS. 1A-1G may be implemented as multiple, distributed devices. Additionally, or alternatively, a set of devices (e.g., one or more devices) shown in FIGS. 1A-1G may perform one or more functions described as being performed by another set of devices shown in FIGS. 1A-1G. For example, the input module 102 may perform one or more functions described as being performed by the power supply unit 104, or vice versa.

Figure 2:
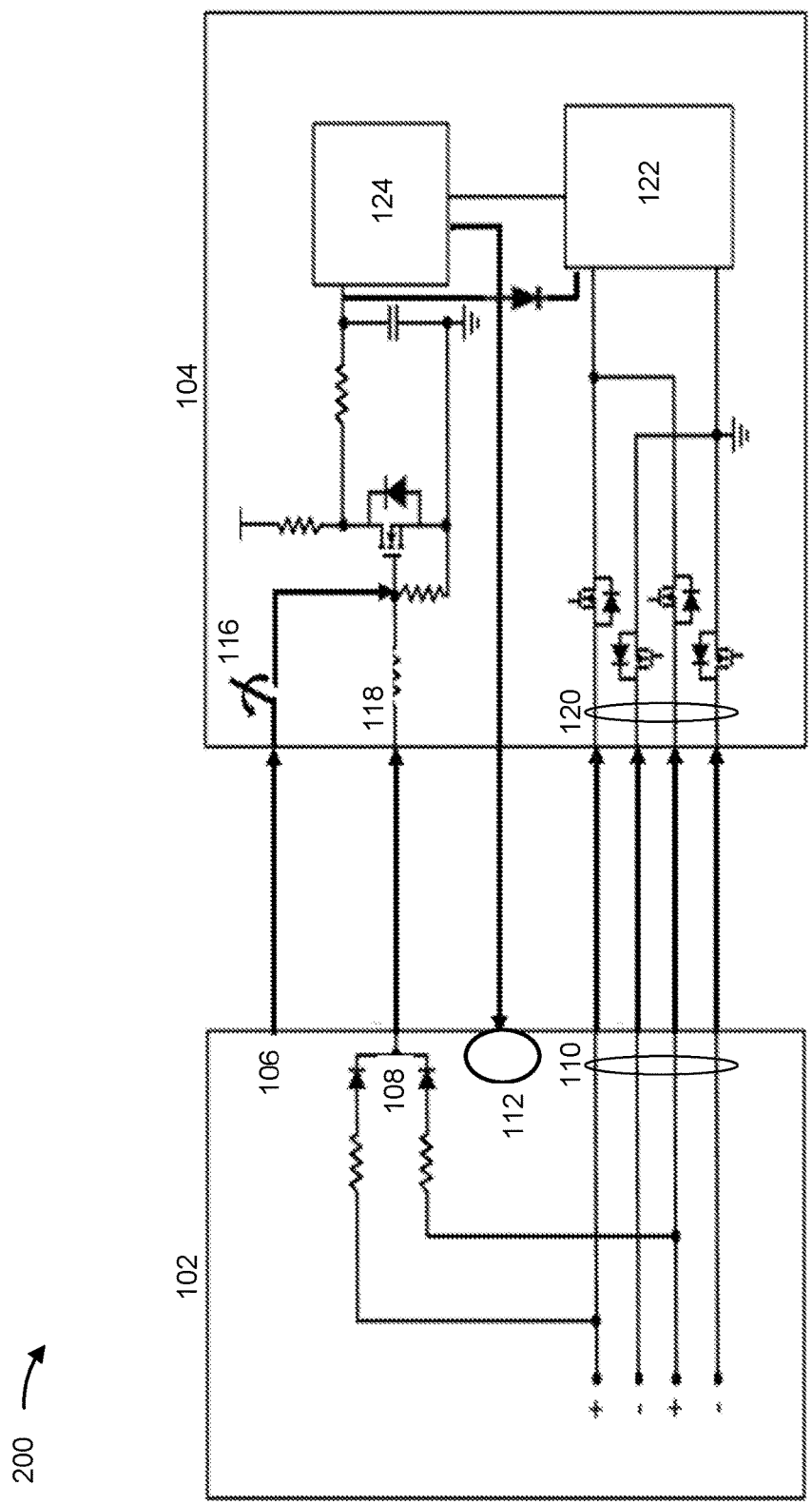
FIG. 2 is an example circuit diagram associated with the power supply assembly described herein.

FIG. 2 is an example circuit diagram 200 associated with the power supply assembly 100 described herein. As shown in FIG. 2, the input module 102 may include one or more captive screws 106, one or more first power supply connection components 108, one or more first input feed connection components 110, one or more visual indicators 112, and/or a handle 114 (not shown in FIG. 2). As further shown in FIG. 2, the power supply unit 104 may include one or more captive screw connection switches 116, one or more second power supply connection components 118, one or more second input feed connection components 120, one or more circuitry elements 122, one or more processors 124, and/or a power switch 126 (not shown in FIG. 2).

As shown in FIG. 2, one or more electrical signals may be provided to the one or more processors 124 when: each captive screw 106, of the one or more captive screws 106, physically engages a corresponding captive screw connection switch 116, of the one or more captive screw connection switches 116; each first power supply connection component 108, of the one or more first power supply connection components 108, physically and electrically connects to a corresponding second power supply connection component 118 of the one or more second power supply connection components 118; each first input feed connection component 110, of the one or more first input feed connection components 110, physically and electrically connects to a corresponding second input feed connection component 120 of the one or more second input feed connection components 120; and/or the power switch 126 is physically set to an on position. In this way, the one or more processors 124 may monitor one or more physical connections and/or electrical connections between the input module 102 and the power supply unit 104, and may therefore activate or deactivate the one or more circuitry elements 122 (e.g., as described herein in relation to FIGS. 1A-1G). As further shown in FIG. 2, the one or more processors 124 may provide one or more signals to the one or more visual indicators 112 (e.g., to cause the one or more visual indicators 112 to indicate information associated with the input module 102 and/or the power supply unit 104, as described herein in relation to FIGS. 1A-1G).

As indicated above, FIG. 2 is provided as an example. Other examples may differ from what is described in connection with FIG. 2.

Figure 3:
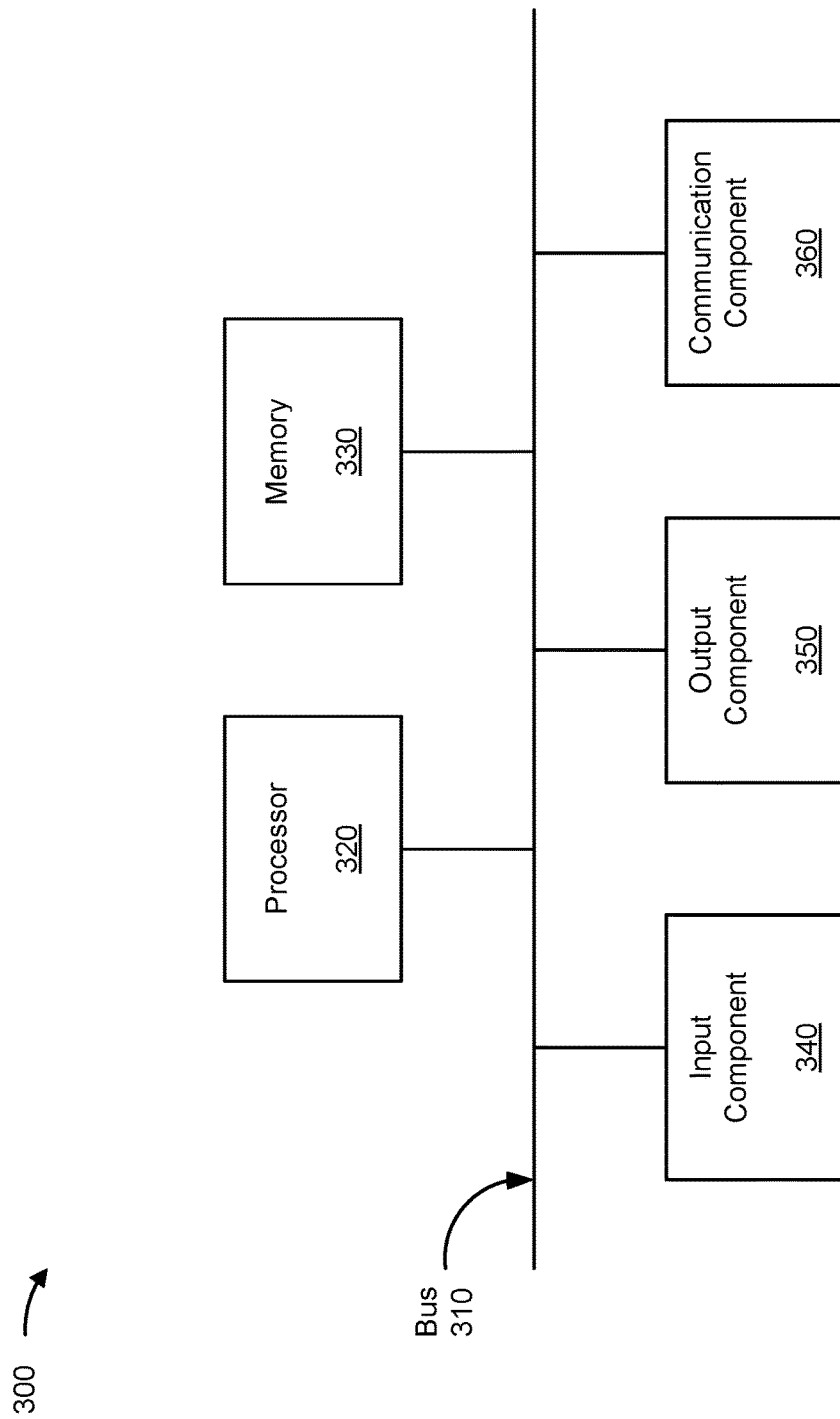
FIG. 3 is a diagram of example components of one or more devices of FIGS. 1A-1G and 2.

FIG. 3 is a diagram of example components of a device 300, which may correspond to input module 102 and/or power supply unit 104. In some implementations, input module 102 and/or power supply unit 104 include one or more devices 300 and/or one or more components of device 300. As shown in FIG. 3, device 300 may include a bus 310, a processor 320, a memory 330, an input component 340, an output component 350, and a communication component 360.

Bus 310 includes one or more components that enable wired and/or wireless communication among the components of device 300. Bus 310 may couple together two or more components of FIG. 3, such as via operative coupling, communicative coupling, electronic coupling, and/or electric coupling. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform one or more operations or processes described elsewhere herein.

Memory 330 includes volatile and/or nonvolatile memory. For example, memory 330 may include random access memory (RAM), read only memory (ROM), a hard disk drive, and/or another type of memory (e.g., a flash memory, a magnetic memory, and/or an optical memory). Memory 330 may include internal memory (e.g., RAM, ROM, or a hard disk drive) and/or removable memory (e.g., removable via a universal serial bus connection). Memory 330 may be a non-transitory computer-readable medium. Memory 330 stores information, instructions, and/or software (e.g., one or more software applications) related to the operation of device 300. In some implementations, memory 330 includes one or more memories that are coupled to one or more processors (e.g., processor 320), such as via bus 310.

Input component 340 enables device 300 to receive input, such as user input and/or sensed input. For example, input component 340 may include a touch screen, a keyboard, a keypad, a mouse, a button, a microphone, a switch, a sensor, a global positioning system sensor, an accelerometer, a gyroscope, and/or an actuator. Output component 350 enables device 300 to provide output, such as via a display, a speaker, and/or a light-emitting diode. Communication component 360 enables device 300 to communicate with other devices via a wired connection and/or a wireless connection. For example, communication component 360 may include a receiver, a transmitter, a transceiver, a modem, a network interface card, and/or an antenna.

Device 300 may perform one or more operations or processes described herein. For example, a non-transitory computer-readable medium (e.g., memory 330) may store a set of instructions (e.g., one or more instructions or code) for execution by processor 320. Processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hardwired circuitry is used instead of or in combination with the instructions to perform one or more operations or processes described herein. Additionally, or alternatively, processor 320 may be configured to perform one or more operations or processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
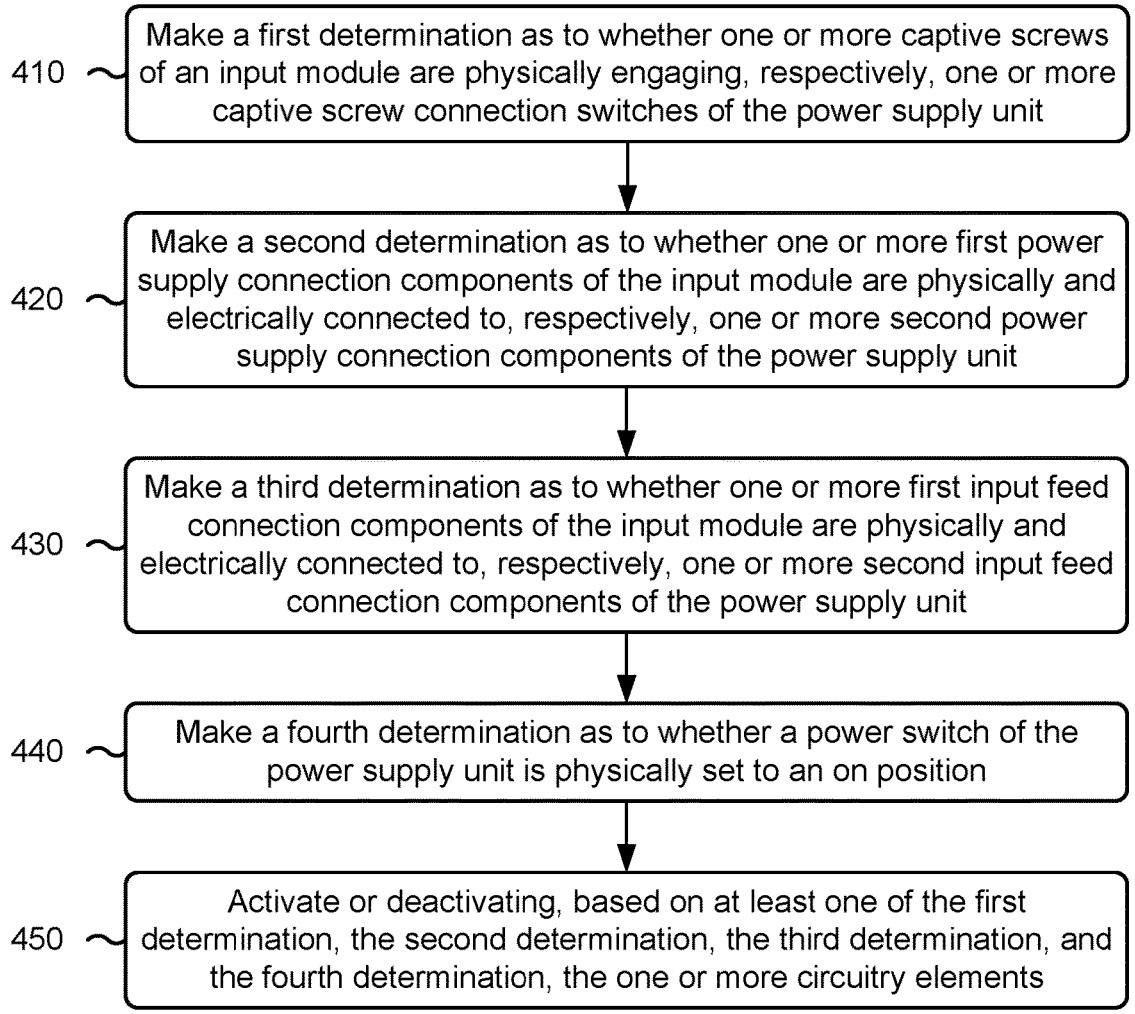
FIG. 4 is a flowchart of an example process relating to activating or deactivating one or more circuitry elements of a power supply unit of the power supply assembly described herein.

FIG. 4 is a flowchart of an example process 400 associated with activating or deactivating one or more circuitry elements (e.g., one or more circuitry elements 122) of a power supply unit (e.g., power supply unit 104). In some implementations, one or more process blocks of FIG. 4 are performed by a one or more processors (e.g., one or more processors 124) of the power supply unit. In some implementations, one or more process blocks of FIG. 4 are performed by another device or a group of devices separate from or including the one or more processors of the power supply unit. Additionally, or alternatively, one or more process blocks of FIG. 4 may be performed by one or more components of device 300, such as processor 320, memory 330, input component 340, output component 350, and/or communication component 360.

As shown in FIG. 4, process 400 may include making a first determination as to whether one or more captive screws of an input module are physically engaging, respectively, one or more captive screw connection switches of the power supply unit (block 410). For example, the one or more processors may make a first determination as to whether one or more captive screws of the input module are physically engaging, respectively, one or more captive screw connection switches of the power supply unit, as described above.

As further shown in FIG. 4, process 400 may include making a second determination as to whether one or more first power supply connection components of the input module are physically and electrically connected to, respectively, one or more second power supply connection components of the power supply unit (block 420). For example, the one or more processors may make a second determination as to whether one or more first power supply connection components of the input module are physically and electrically connected to, respectively, one or more second power supply connection components of the power supply unit, as described above.

As further shown in FIG. 4, process 400 may include making a third determination as to whether one or more first input feed connection components of the input module are physically and electrically connected to, respectively, one or more second input feed connection components of the power supply unit (block 430). For example, the one or more processors may make a third determination as to whether one or more first input feed connection components of the input module are physically and electrically connected to, respectively, one or more second input feed connection components of the power supply unit, as described above.

As further shown in FIG. 4, process 400 may include making a fourth determination as to whether a power switch of the power supply unit is physically set to an on position (block 440). For example, the one or more processors may make a fourth determination as to whether a power switch of the power supply unit is physically set to an on position, as described above.

As further shown in FIG. 4, process 400 may include activating or deactivating, based on at least one of the first determination, the second determination, the third determination, and the fourth determination, the one or more circuitry elements (block 450). For example, the one or more processors may activate or deactivate, based on at least one of the first determination, the second determination, the third determination, and the fourth determination, the one or more circuitry elements, as described above.

Process 400 may include additional implementations, such as any single implementation or any combination of implementations described below and/or in connection with one or more other processes described elsewhere herein.

In a first implementation, activating or deactivating the one or more circuitry elements comprises activating, based on each of the first determination, the second determination, the third determination, and the fourth determination being a positive determination, the one or more circuitry elements.

In a second implementation, alone or in combination with the first implementation, activating or deactivating the one or more circuitry elements comprises deactivating, based on at least one of the first determination, the second determination, the third determination, or the fourth determination not being a positive determination, the one or more circuitry elements.

In a third implementation, alone or in combination with one or more of the first and second implementations, process 400 includes providing one or more signals to one or more visual indicators of the input module, wherein providing the one or more signals is to cause the one or more visual indicators to indicate at least one of a status of a feed connection associated with a first input feed connection component, of the one or more first input feed connection components, or a corresponding second input feed connection component of the one or more second input feed connection components, a status of a physical and electrical connection between the input module and the power supply unit, a status associated with activation of the one or more circuitry elements, or a status associated with the power switch.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, satisfying a threshold may, depending on the context, refer to a value being greater than the threshold, greater than or equal to the threshold, less than the threshold, less than or equal to the threshold, equal to the threshold, not equal to the threshold, or the like.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or,"

unless explicitly stated otherwise (e.g., if used in combination with "either" or "only one of").

What is claimed is:

1. A power supply assembly, comprising:
an input module including:
one or more captive screws,
one or more first power supply connection components,
one or more first input feed connection components, and
one or more visual indicators; and
a power supply unit that is to be physically and electrically connected to the input module, the power supply unit including:
one or more captive screw connection switches,
one or more second power supply connection components,
one or more second input feed connection components,
a power switch,
one or more circuitry elements, and
one or more processors that are to:
make a first determination as to whether the one or more captive screws are physically engaging, respectively, the one or more captive screw connection switches,
make a second determination as to whether the one or more first power supply connection components are physically and electrically connected to, respectively, the one or more second power supply connection components,
make a third determination as to whether the one or more first input feed connection components are physically and electrically connected to, respectively, the one or more second input feed connection components,
make a fourth determination as to whether the power switch is physically set to an on position, and
activate or deactivate the one or more circuitry elements based on at least one of the first determination, the second determination, the third determination, or the fourth determination.

2. The power supply assembly of claim 1, wherein:
the one or more captive screws, when the input module and the power supply unit are physically connected, are to physically engage, respectively, the one or more captive screw connection switches,
wherein the one or more captive screws physically engaging, respectively, the one or more captive screw connection switches is to facilitate activation of the one or more circuitry elements.

3. The power supply assembly of claim 1, wherein:
the one or more first power supply connection components, when the input module and the power supply unit are physically connected, are to physically and electrically connect to, respectively, the one or more second power supply connection components,
wherein the one or more first power supply connection components physically and electrically connecting to, respectively, the one or more second power supply connection components is to facilitate activation of the one or more circuitry elements.

4. The power supply assembly of claim 1, wherein:
the one or more first input feed connection components, when the input module and the power supply unit are physically connected, are to physically and electrically connect to, respectively, the one or more second input feed connection components,
wherein the one or more first input feed connection components physically and electrically connecting to, respectively, the one or more second input feed connection components is to facilitate activation of the one or more circuitry elements.

5. The power supply assembly of claim 1, wherein the one or more visual indicators are to indicate at least one of:
a status of a feed connection associated with a first input feed connection component, of the one or more first input feed connection components, or a corresponding second input feed connection component of the one or more second input feed connection components;
a status of a physical and electrical connection between the input module and the power supply unit;
a status associated with activation of the one or more circuitry elements; or
a status associated with the power switch.

6. The power supply assembly of claim 1, wherein the one or more processors, when activating or deactivating the one or more circuitry elements, are to:
activate, based on each of the first determination, the second determination, the third determination, and the fourth determination being a positive determination, the one or more circuitry elements.

7. The power supply assembly of claim 1, wherein the one or more processors, when activating or deactivating the one or more circuitry elements, are to:
deactivate, based on at least one of the first determination, the second determination, the third determination, or the fourth determination not being a positive determination, the one or more circuitry elements.

8. The power supply assembly of claim 1, wherein the one or more processors are further to:
provide one or more signals to the one or more visual indicators,
wherein providing the one or more signals is to cause the one or more visual indicators to indicate at least one of:
a status of a feed connection associated with a first input feed connection component, of the one or more first input feed connection components, or a corresponding second input feed connection component of the one or more second input feed connection components;
a status of a physical and electrical connection between the input module and the power supply unit;
a status associated with activation of the one or more circuitry elements; or
a status associated with the power switch.

9. The power supply assembly of claim 1, wherein the one or more visual indicators include one or more light emitting diodes or one or more liquid crystal display panels.

10. A power supply assembly, comprising:
an input module including:
one or more captive screws;
one or more first power supply connection components; and
one or more first input feed connection components, wherein:
a power supply unit that is to physically and electrically connect to the input module, the power supply unit including:
one or more captive screw connection switches,
one or more second power supply connection components,
one or more second input feed connection components, one or more circuitry elements, and
one or more processors that are to:
- make a first determination as to whether the one or more captive screws are physically engaging, respectively, the one or more captive screw connection switches,
- make a second determination as to whether the one or more first power supply connection components are physically and electrically connected to, respectively, the one or more second power supply connection components,
- make a third determination as to whether the one or more first input feed connection components are physically and electrically connected to, respectively, the one or more second input feed connection components, and
- activate or deactivate the one or more circuitry elements based on at least one of the first determination, the second determination, or the third determination.

11. The power supply assembly of claim 10, wherein the one or more captive screws are to physically engage, respectively, the one or more captive screw connection switches to facilitate activation of the one or more circuitry elements.

12. The power supply assembly of claim 10, wherein the one or more first power supply connection components are to physically and electrically connect to, respectively, the one or more second power supply connection components to facilitate activation of the one or more circuitry elements.

13. The power supply assembly of claim 10, wherein the one or more first input feed connection components are to physically and electrically connect to, respectively, the one or more second input feed connection components to facilitate activation of the one or more circuitry elements.

14. The power supply assembly module of claim 10, wherein the input module further includes one or more visual indicators that indicate at least one of:
- a status of a feed associated with a first input feed connection component, of the one or more first input feed connection components, or a corresponding second input feed connection component of the one or more second input feed connection components;
- a status of a physical and electrical connection between the input module and the power supply unit;
- a status associated with activation of the one or more circuitry elements; or
- a status associated with a power switch of the power supply unit.

15. The power supply assembly of claim 14, wherein the one or more visual indicators include one or more light emitting diodes or one or more liquid crystal display panels.

16. The power supply assembly of claim 10, wherein the input module further includes a handle that is to facilitate physical and electrical connection or disconnection of the input module and the power supply unit by a technician.

17. A power supply unit for physical and electrical connection to an input module, the power supply unit comprising:
- one or more captive screw connection switches that are to be, respectively, physically engaged by one or more captive screws of the input module;
- one or more second power supply connection components that are to physically and electrically connect to, respectively, one or more first power supply connection components of the input module;
- one or more second input feed connection components that are to physically and electrically connect to, respectively, one or more first input feed connection components of the input module;
- a power switch;
- one or more circuitry elements; and
- one or more processors that are to:
  - make a first determination as to whether the one or more captive screw connection switches are physically engaging, respectively, the one or more captive screws,
  - make a second determination as to whether the one or more second power supply connection components are physically and electrically connected to, respectively, the one or more first power supply connection components,
  - make a third determination as to whether the one or more second input feed connection components are physically and electrically connected to, respectively, the one or more first input feed connection components,
  - make a fourth determination as to whether the power switch is physically set to an on position, and
  - activate or deactivate the one or more circuitry elements based on at least one of the first determination, the second determination, the third determination, or the fourth determination.

18. The power supply unit of claim 17, wherein the one or more captive screws physically engaging, respectively, the one or more captive screw connection switches is to facilitate activation of the one or more circuitry elements.

19. The power supply unit of claim 17, wherein the one or more second power supply connection components physically and electrically connecting to, respectively, the one or more first power supply connection components is to facilitate activation of the one or more circuitry elements.

20. The power supply unit of claim 17, wherein the one or more second input feed connection components physically and electrically connecting to, respectively, the one or more first input feed connection components is to facilitate activation of the one or more circuitry elements.

* * * * *

UNITED STATES PATENT AND TRADEMARK OFFICE
CERTIFICATE OF CORRECTION

PATENT NO.         : 11,994,924 B2
APPLICATION NO.    : 17/651688
DATED              : May 28, 2024
INVENTOR(S)        : Varaha Venkata Satya Narayana Jagarapu et al.

Page 1 of 1

It is certified that error appears in the above-identified patent and that said Letters Patent is hereby corrected as shown below:

In the Claims

In Claim 14, Column 15, Line 36, "The power supply assembly module of claim 10," should be changed to --The power supply assembly of claim 10,--.

Signed and Sealed this
Ninth Day of July, 2024

Katherine Kelly Vidal
*Director of the United States Patent and Trademark Office*